United States Patent
Boyd, Jr. et al.

(10) Patent No.: US 10,648,788 B2
(45) Date of Patent: May 12, 2020

(54) SUBSTRATE DISTANCE MONITORING

(71) Applicant: Applied Materials, Inc., Santa Clara, CA (US)

(72) Inventors: Wendell Glenn Boyd, Jr., Morgan Hill, CA (US); Govinda Raj, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 307 days.

(21) Appl. No.: 15/591,902

(22) Filed: May 10, 2017

(65) Prior Publication Data

US 2017/0350688 A1    Dec. 7, 2017

Related U.S. Application Data

(60) Provisional application No. 62/345,543, filed on Jun. 3, 2016.

(51) Int. Cl.
| | | |
|---|---|---|
| C23C 16/40 | (2006.01) | |
| G01B 9/02 | (2006.01) | |
| G01B 11/14 | (2006.01) | |
| H01J 37/32 | (2006.01) | |
| H01L 21/67 | (2006.01) | |

(52) U.S. Cl.
CPC ......... *G01B 9/02023* (2013.01); *G01B 11/14* (2013.01); *H01J 37/32715* (2013.01); *H01L 21/67259* (2013.01)

(58) Field of Classification Search
CPC ................ G01B 9/02023; G01B 11/14; H01J 37/32715; H01J 37/3244; H01L 21/67259; C23C 16/45565

USPC .......... 118/668, 715; 156/345.24, 64, 345.15
See application file for complete search history.

(56) References Cited

U.S. PATENT DOCUMENTS

| | | | | |
|---|---|---|---|---|
| 5,733,511 A | * | 3/1998 | De Francesco ... | H01J 37/32174 422/186.05 |
| 5,976,260 A | * | 11/1999 | Kinoshita ............. | B25B 11/005 118/719 |
| 6,821,910 B2 | * | 11/2004 | Adomaitis .......... | C23C 16/4412 118/715 |
| 6,950,774 B2 | * | 9/2005 | Donald .................... | G01C 9/00 118/715 |

(Continued)

FOREIGN PATENT DOCUMENTS

| | | |
|---|---|---|
| CN | 103534799 A | 1/2014 |
| CN | 104862672 A | 8/2015 |

(Continued)

OTHER PUBLICATIONS

International Search Report and Written Opinion for PCT/US2017/031597 dated Aug. 10, 2017.

(Continued)

*Primary Examiner* — Rudy Zervigon
(74) *Attorney, Agent, or Firm* — Patterson + Sheridan, LLP

(57) ABSTRACT

Embodiments disclosed herein include a faceplate having a sensor assembly, a processing chamber having the same, and a method for monitoring a substrate in a processing chamber. In one embodiment, a faceplate is configured to introduce processing gases into a plasma processing chamber. The faceplate has one or more holes. A sensor assembly is disposed in the one or more holes. The sensor assembly has a sensor and a controller.

20 Claims, 10 Drawing Sheets

(56) References Cited

U.S. PATENT DOCUMENTS

| | | | |
|---|---|---|---|
| 7,018,553 B2* | 3/2006 | Liu | C23C 16/509 118/723 E |
| 7,462,335 B2* | 12/2008 | Liu | C23C 16/509 118/723 ER |
| 7,540,923 B2* | 6/2009 | Takagi | H01J 37/3244 118/666 |
| 7,568,378 B2* | 8/2009 | Yoshikawa | G01N 27/4071 73/31.05 |
| 7,833,381 B2* | 11/2010 | Johnson | C23C 16/52 156/345.24 |
| 7,922,863 B2* | 4/2011 | Ripley | C23C 16/45565 118/723 MP |
| 7,942,968 B2* | 5/2011 | Kang | C23C 16/44 118/715 |
| 8,138,444 B2* | 3/2012 | Kim | H01L 21/67265 118/723 I |
| 8,372,203 B2* | 2/2013 | Chacin | C23C 16/46 118/724 |
| 9,175,391 B2* | 11/2015 | Endo | C23C 16/45565 |
| 9,771,266 B2* | 9/2017 | Matsumoto | B82Y 40/00 |
| 9,837,254 B2* | 12/2017 | Berry, III | H01J 37/36 |
| 10,184,786 B2* | 1/2019 | Matsudo | H01J 37/3288 |
| 10,196,741 B2* | 2/2019 | Griffin | C23C 16/4584 |
| 10,312,120 B2* | 6/2019 | Ravid | H01L 21/67259 |
| 10,403,476 B2* | 9/2019 | Gregor | H01J 37/32697 |
| 10,460,916 B2* | 10/2019 | Boyd, Jr. | H01L 21/67259 |
| 10,481,122 B2* | 11/2019 | Igarashi | G01N 27/4071 |
| 10,508,338 B2* | 12/2019 | Matsumoto | C23C 16/4401 |
| 10,514,356 B2* | 12/2019 | Hino | G01N 33/0027 |
| 2003/0038112 A1* | 2/2003 | Liu | C23C 16/509 216/60 |
| 2003/0201162 A1* | 10/2003 | Liu | C23C 16/509 204/192.13 |
| 2004/0050496 A1* | 3/2004 | Iwai | H01J 37/20 156/345.51 |
| 2004/0143412 A1* | 7/2004 | Donald | G01C 9/00 702/150 |
| 2005/0118737 A1* | 6/2005 | Takagi | H01J 37/3244 438/14 |
| 2006/0152734 A1* | 7/2006 | Suzuki | G01B 11/0675 356/479 |
| 2006/0196846 A1* | 9/2006 | Honda | C23F 4/00 216/60 |
| 2006/0196847 A1* | 9/2006 | Honda | C23F 4/00 216/67 |
| 2006/0203232 A1* | 9/2006 | Okita | G03F 1/84 356/237.2 |
| 2006/0254514 A1* | 11/2006 | Kang | C23C 16/44 118/715 |
| 2008/0152840 A1* | 6/2008 | Ripley | C23C 16/45565 427/595 |
| 2008/0173069 A1* | 7/2008 | Yoshikawa | G01N 27/4071 73/31.05 |
| 2008/0246493 A1 | 10/2008 | Gardner | |
| 2008/0277064 A1* | 11/2008 | Kim | H01J 37/32091 156/345.38 |
| 2009/0186483 A1* | 7/2009 | Saito | H01J 37/32935 438/689 |
| 2009/0250443 A1* | 10/2009 | Kim | H01L 21/67069 219/121.36 |
| 2010/0055312 A1* | 3/2010 | Kato | C23C 16/45502 427/255.26 |
| 2010/0124610 A1* | 5/2010 | Aikawa | C23C 16/4584 427/255.28 |
| 2011/0235056 A1* | 9/2011 | Matsudo | G01B 11/06 356/630 |
| 2011/0253044 A1* | 10/2011 | Tam | C23C 16/45519 118/666 |
| 2012/0304928 A1 | 12/2012 | Koelmel et al. | |
| 2014/0151334 A1* | 6/2014 | Matsumoto | B82Y 40/00 216/69 |
| 2015/0168130 A1* | 6/2015 | Matsudo | H01J 37/3288 156/345.24 |
| 2015/0225854 A1 | 8/2015 | Madsen | |
| 2015/0291425 A1* | 10/2015 | Matsumoto | B82Y 40/00 216/69 |
| 2015/0352587 A1 | 12/2015 | Ichino et al. | |
| 2015/0376782 A1* | 12/2015 | Griffin | C23C 16/4584 118/712 |
| 2016/0020074 A1 | 1/2016 | Mohn et al. | |
| 2016/0027675 A1* | 1/2016 | Ravid | H01L 21/67259 118/713 |
| 2017/0076915 A1* | 3/2017 | Boyd, Jr. | H01J 37/32715 |
| 2017/0350688 A1* | 12/2017 | Boyd, Jr. | G01B 9/02023 |
| 2018/0180570 A1* | 6/2018 | Hino | G01N 27/4062 |
| 2018/0313781 A1* | 11/2018 | Segawa | G01N 27/4077 |
| 2018/0330926 A1* | 11/2018 | Boyd, Jr. | H01L 21/67253 |
| 2019/0006157 A1* | 1/2019 | O'Banion | G02B 6/0208 |
| 2019/0137260 A1* | 5/2019 | Matsudo | H01J 37/3288 |
| 2019/0138033 A1* | 5/2019 | Sawachi | C23C 16/45561 |

FOREIGN PATENT DOCUMENTS

| | | |
|---|---|---|
| CN | 105225985 A | 1/2016 |
| JP | S57108633 A | 7/1982 |
| JP | H09063967 A | 3/1997 |
| JP | 2000323451 A | 11/2000 |
| JP | 2004289000 A | 10/2004 |
| TW | I425188 B | 2/2014 |
| TW | I521637 B | 2/2016 |

OTHER PUBLICATIONS

Office Action from Taiwan Application No. 106115934 dated Feb. 12, 2019.

Office Action for Japanese Patent Application No. 2018-563441 dated Nov. 11, 2019.

Office Action for Korean Patent Application No. 10-2018-7037918 dated Dec. 19, 2019, with concise statement of relevance.

Office Action for Chinese Patent Application No. 201780034449.1 dated Dec. 30, 2019.

* cited by examiner

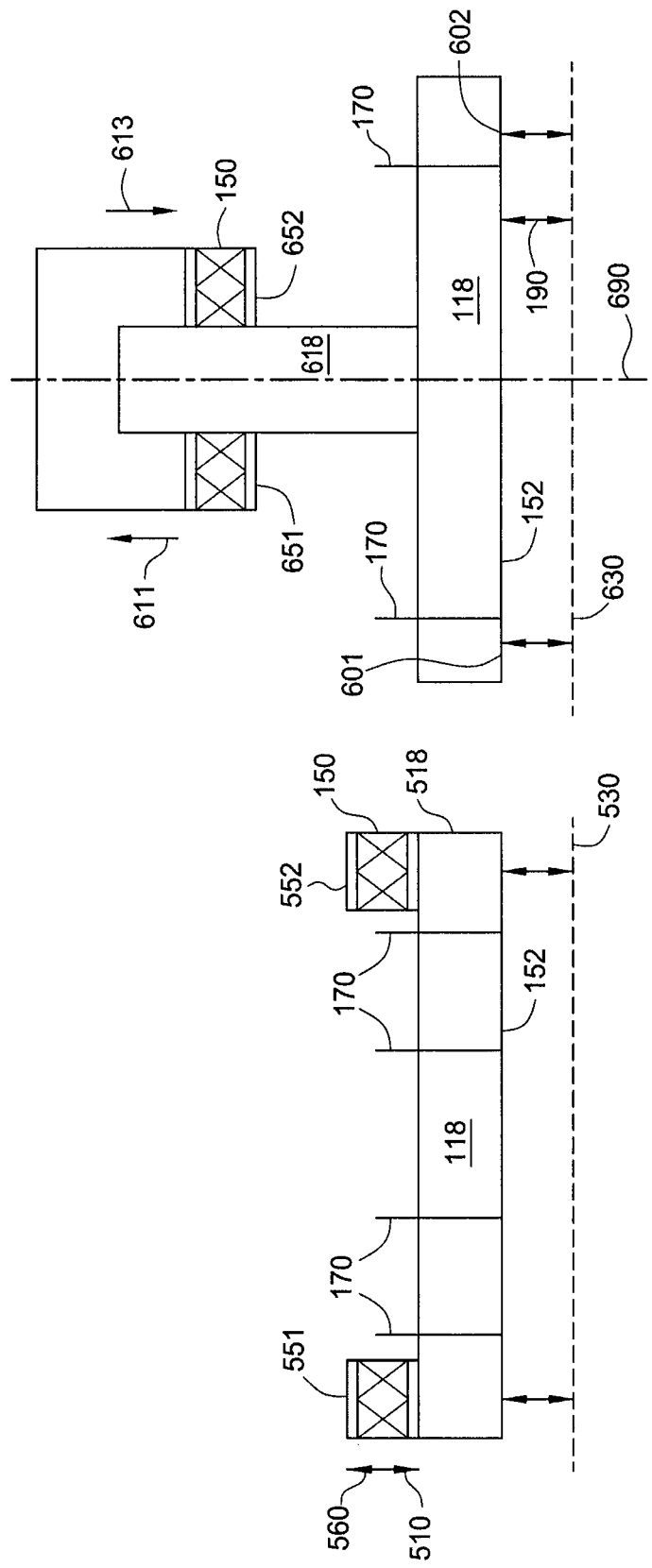

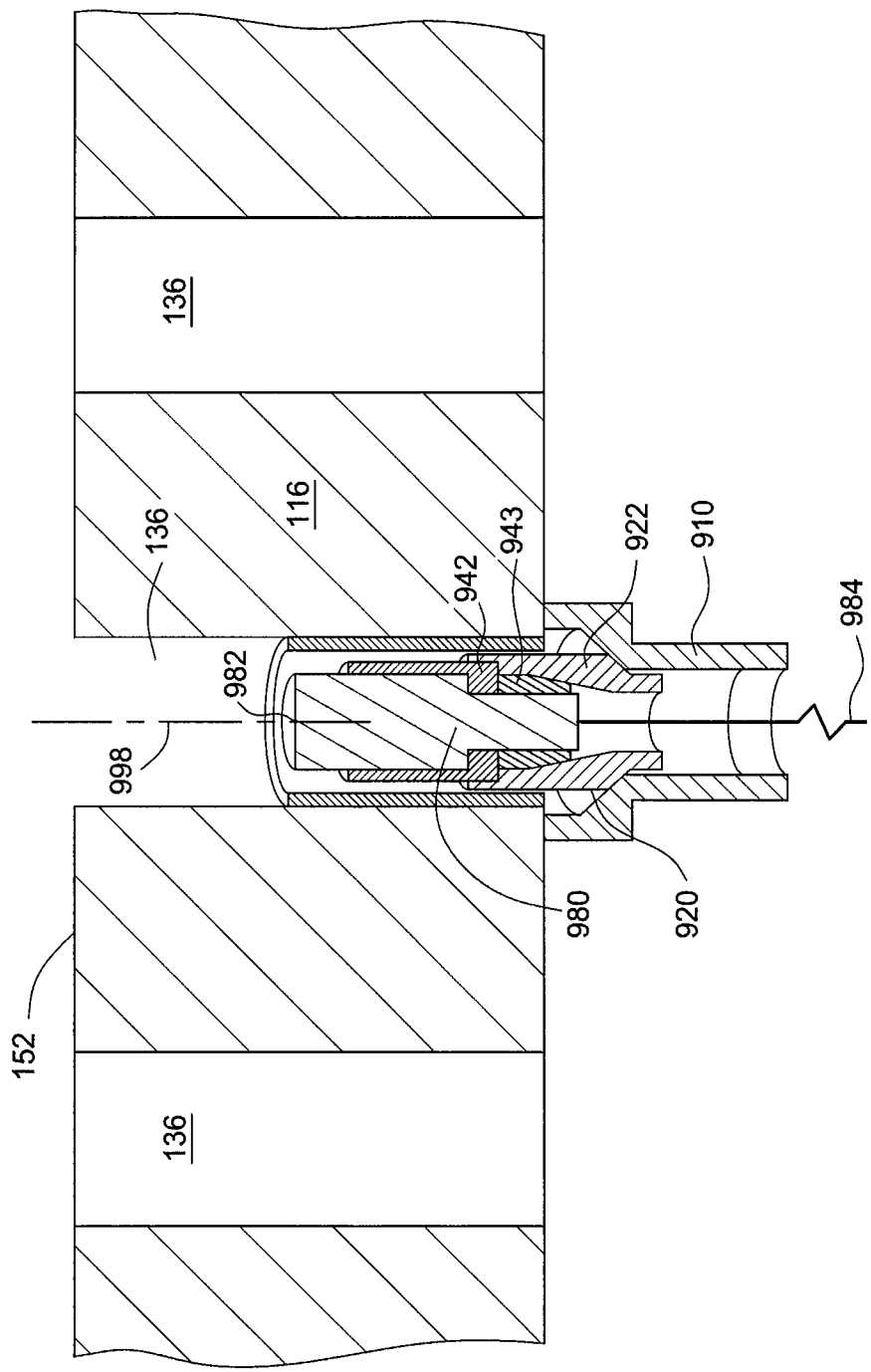

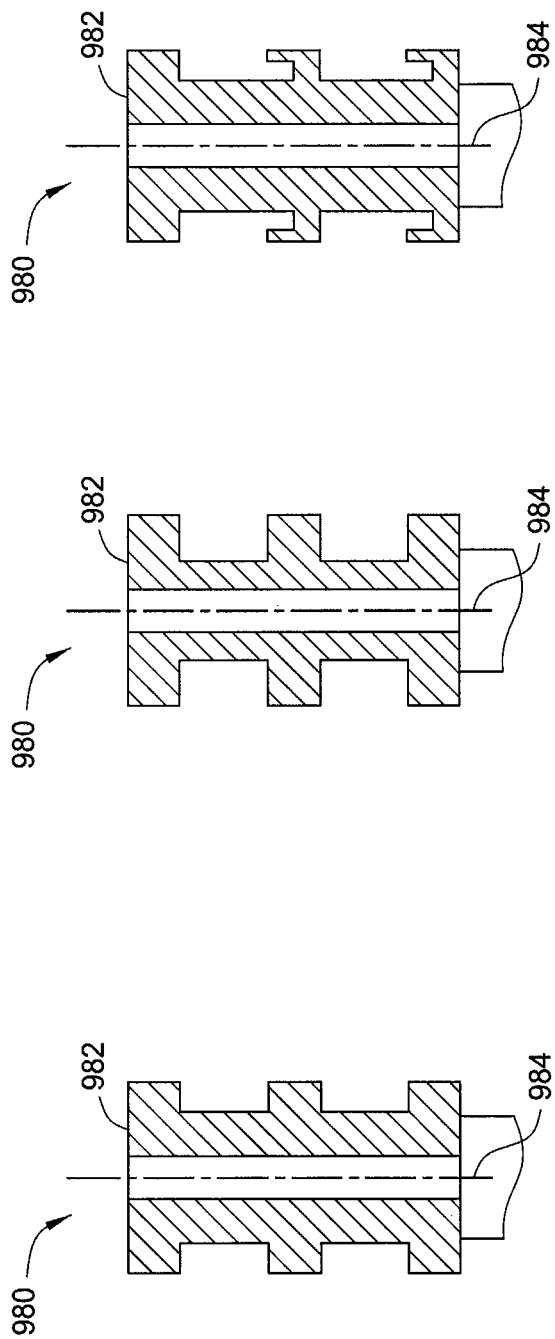

SUBSTRATE DISTANCE MONITORING

CROSS-REFERENCE TO RELATED APPLICATIONS

This application claims benefit of U.S. Provisional Application Ser. No. 62/345,543, filed Jun. 3, 2016, of which is incorporated by reference in its entirety.

BACKGROUND

Field

Embodiments of the present invention generally relate to plasma processing chambers for fabricating microelectronic devices and, more specifically, to sensors used for determining process parameters for a substrate therein.

Description of the Related Art

In high precision manufacturing, for example semiconductor manufacturing, a substrate may need to be precisely held by a fixture during manufacturing operations to increase uniform quality and reduce defects. In some manufacturing operations, a heated substrate support may be used as the fixture to support the substrate during one or more manufacturing operations.

In semiconductor substrate processing chambers, many processes are very sensitive to the gap (spacing) defined between substrates and a faceplate of a showerhead utilized in the chamber to provide gases for processing the substrate. The uniformity of the gap across the substrate is an important factor for obtaining satisfactory substrate processing results. Additionally, high chamber processing temperatures cause thermal expansion of the cold substrate when placed on a substrate support within the processing chamber, which may lead to processing and transfer problems. In some processes, such as atomic layer deposition (ALD) which utilizes a rotating substrate support, the early detection of the substrate being out of pocket (OOP) will avoid the high cost associated with chamber recovery due to the substrate hitting the showerhead and breaking inside chamber.

Therefore, there is a need for an improved method and apparatus for monitoring the position of a substrate on a substrate support.

SUMMARY

Embodiments disclosed herein include a faceplate having a sensor assembly, a processing chamber having the same, and a method for monitoring a substrate distance. In one embodiment, a faceplate is configured to introduce processing gases into a plasma processing chamber. A sensor assembly is disposed in a hole formed in the faceplate. The sensor assembly is operable to provide a metric indicative of a distance that a substrate is positioned below the faceplate.

In another embodiment, a processing chamber has a chamber body. The chamber body has a chamber lid, chamber walls and a chamber bottom wherein the chamber body encloses a chamber interior volume. A substrate support having a workpiece support surface is disposed in the chamber interior volume. A faceplate is supported from the chamber lid in the interior volume. The faceplate is configured to introduce processing gases into the plasma processing chamber. A sensor assembly is disposed in a hole formed in the faceplate. The sensor assembly is operable to provide a metric indicative of a distance that a substrate is positioned below the faceplate.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings and included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

FIG. 5 illustrates one embodiment for the showerhead having actuators for adjusting the position of the showerhead within the processing chamber.

FIG. 6 illustrates another embodiment for the showerhead having actuators for adjusting the position of the showerhead within the processing chamber.

FIG. 9 is a partial cross-sectional isometric view of the substrate support having a sensor assembly mounted in a backside gas through hole.

FIGS. 12A through 12C are example configurations of a sensor head.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include a sensor assembly disposed in a hole formed in a faceplate of a showerhead configured to provide process gas into a semiconductor processing chamber. The sensor assembly allows the distance between a substrate disposed on a substrate support within the processing chamber and the faceplate to be derived. The sensor assembly is operable to provide a metric indicative of a distance that a substrate is positioned below the faceplate. When multiple sensor assemblies are utilize, and/or when the substrate rotates under one or more sensor assemblies, the metric obtained by the sensor one or more sensor assemblies may be utilized to detect a metric indicative of a misalignment of the substrate disposed on the substrate support surface or substrate positioned outside of process parameters. Additionally, sensor assemblies disposed at multiple locations on the faceplate may also be utilized to determine if lift pins and the substrate support is positioned correctly for processing. The sensor assemblies may provide real-time measurements of the distance to the substrate disposed on the substrate support for fine tuning process parameters. For example, a control system may utilize the distance information obtained from the sensor assembly to modify the height of the substrate support to maintain a target distance between the substrate and the showerhead or check for substrate alignment and out of pocket issues and/or to align the faceplate and substrate in a substantially parallel orientation. In this manner, processing parameters for the substrate disposed on the substrate support may be tightly controlled and substrate damage may be prevented resulting from misalignment or out of pocket issues. In one example, the sensor assembly may be laser sensor utilized to monitor the gap value between the substrate and the face place of the showerhead for determining substrate determining if the substrate is out of a receiving pocket formed on the substrate support. The sensor assembly also provides real-time substrate to faceplate distance information which can be utilized for real-time process control. In some configurations, the sensor assembly may also be able to detect bowing in the substrate and provide feedback to affect corrective measures for ensuring quality of the film disposed on the substrate.

Figure 1:
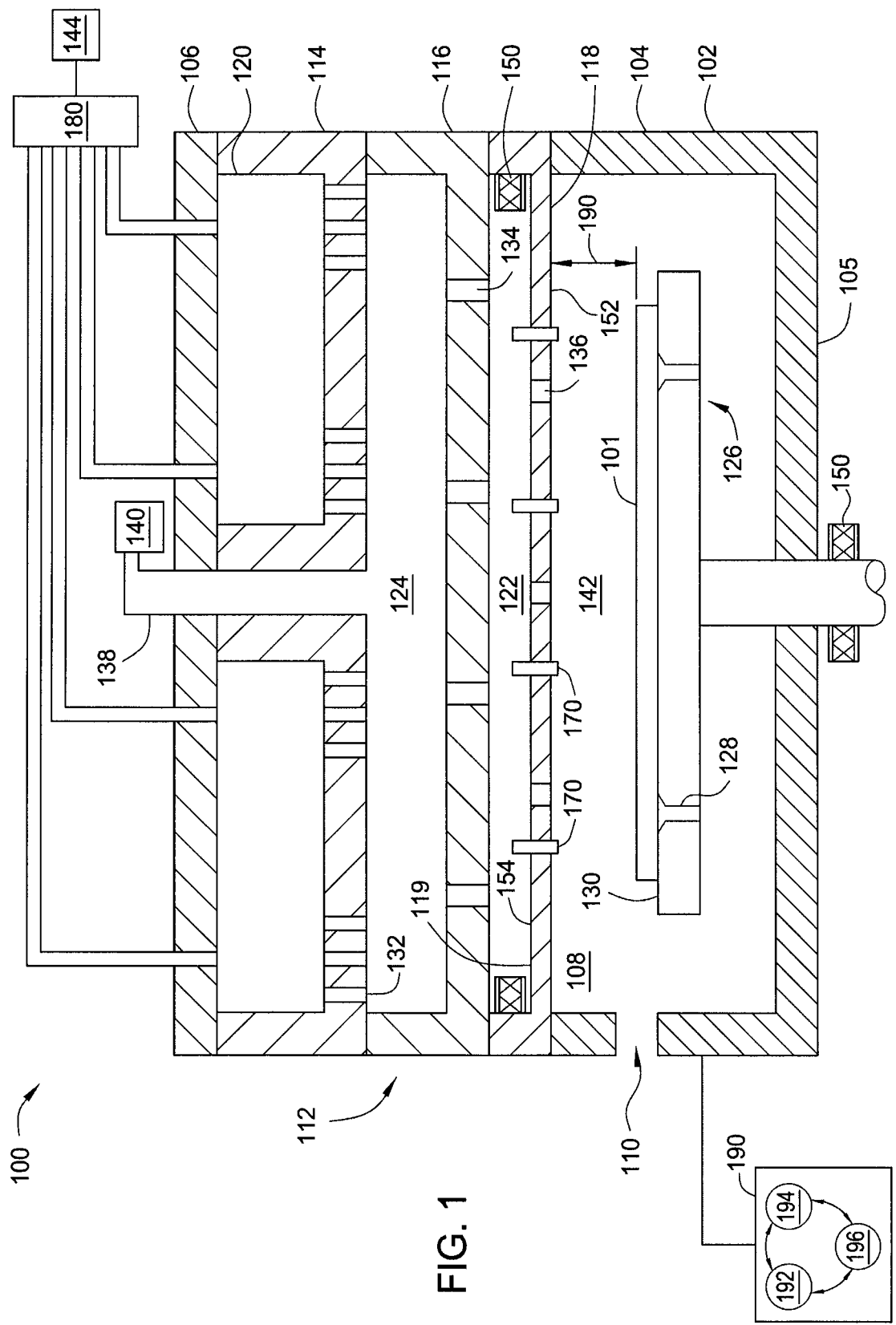
FIG. 1 is a schematic side view of an exemplary plasma processing chamber having a showerhead and a substrate support installed therein.

FIG. 1 illustrates a chemical vapor deposition (CVD) processing chamber 100 having a showerhead assembly 112, according to one embodiment. The processing chamber 100 includes a chamber body 102 having sidewalls 104, a bottom 105, and a lid 106. The sidewalls 104 and lid 106 define an interior volume 108. A substrate transfer port 110 may be formed in the sidewall 104 for transferring substrates into and out of the interior volume 108.

The processing chamber 100 has a control system 198 coupled thereto. The control system 198 includes a central processing unit (CPU) 192, a memory 194, and support circuits 196. The control system 198 is utilized to control processing chamber 100. Software routines, when executed by the CPU 192, transform the CPU 192 into a specific purpose computer (controller) 190 that controls the processes and equipment disposed within the interior volume 108 of the processing chamber 100.

A substrate support 126 is disposed within the interior volume 108 of the processing chamber 100 below the showerhead assembly 112. The substrate support 126 is vertically moveable between a lower loading position (as shown) and an elevated processing position (not shown). The substrate support 126 is configured to support a substrate 101 during processing. The substrate support 126 may include a plurality of lift pins 128 movably disposed therethrough. The lift pins 128 may be actuated to project from a support surface 130 of the substrate support 126, thereby placing the substrate 101 in a spaced-apart relation to the substrate support 126 to facilitate transfer with a transfer robot (not shown) through the substrate transfer port 110.

The showerhead assembly 112 is disposed in the interior volume 108 and is coupled to the lid 106. The showerhead assembly 112 includes an underplate 114 and a faceplate 118. The underplate 114 is positioned below the lid 106 such that a first plenum 120 is formed between the underplate 114 and the lid 106. In one embodiment, the showerhead assembly 112 further includes a diffuser plate 116 positioned between the underplate 114 and the faceplate 118. The diffuser plate 116 forms a second plenum 124 between the underplate 114 and the diffuser plate 116 and a third plenum 122 between the diffuser plate 116 and the faceplate 118.

The first plenum 120 is configured to receive an inert gas from a gas delivery system 180 coupled to an inert gas source 144. The underplate 114 is configured to provide the inert gas from the first plenum 120 to the second plenum 124. The underplate 114 includes a plurality of apertures 132. The apertures 132 allow for fluid communication between the first plenum 120 and the second plenum 124. The plurality of apertures 132 are positioned beneath the first plenum 120 in the underplate 114.

The processing chamber 100 further includes a central conduit 138. The central conduit 138 is formed through the lid 106 and opens into the second plenum 124. The central conduit 138 is configured to provide a process gas to the second plenum 124 from the process gas source 140. In the second plenum 124, the process gas supplied by the central conduit 138 mixes with the inert gas provided from the underplate 114. Multiple zones may be created in the first plenum 120 and or the second plenum 124 to allow for a gradient in the distribution of the process gas exiting the faceplate 118 and delivered to the substrate 101 to improve film deposition properties. In some embodiments, the distribution of the process gas exiting the faceplate 118 and delivered to the substrate 101 is uniformly provided.

The diffuser plate 116 includes a plurality of apertures 134. The plurality of apertures 134 allows for fluid communication between the second plenum 124 and the third plenum 122. The diffuser plate 116 is configured to disperse the gas mixture provided to the third plenum 122. The third plenum 122 is in fluid communication with a processing region 142 defined between the faceplate 118 and the substrate support 126 through a plurality of apertures or gas holes 136 formed through the faceplate 118. The apertures 134 allow for fluid communication between the third plenum 122 and the processing region 142.

The faceplate 118 has a disk shaped body 119. The faceplate 118 has a bottom surface 152 facing the processing region 142 of the processing chamber 100 and a top surface 154 opposite the bottom surface 152. In one embodiment, the top surface 154 faces the third plenum 122. A gap 190 is defined between the faceplate 118 and the substrate 101 supported on the substrate support 126. The gap 190 is a measure of the distance between the substrate 101 and the faceplate 118. The gap 190 may range from a minimum when the substrate support 126 is in the elevated processing position to a maximum when the substrate support 126 is in the lower loading position.

The disk shaped body 119 may have one or more sensor assemblies 170 disposed therein. The sensor assembly 170 may be in communication with a control system 198. The sensor assembly 170 is operable to provide a metric indicative of the gap 190. The metric may be utilized to determine the location of the substrate 101 on the support surface 172. In one example, the metric provided by the sensor assembly 170 is provided to the control system 198 which utilizes the metric to determine the gap 190 between the faceplate 118 and the substrate 101 based on the distance measured by the sensor assembly 170 to the substrate 101. In this manner, the control system 198 may adjust the gap 190 by adjusting the substrate support height to maintain a desired (i.e., target) distance across the gap 190. The metric provided by the sensor assembly 170 may be utilized to determine equipment issues such as stuck lift pins, substrate support misalignment, flatness run out or misalignment of the substrate 101 and/or maintaining the gap 190 at a target range for additional process control for improving film quality.

Upon determination of the gap 190, the control system 198 may modify the substrate support 126 or lift pin 109 positions to properly align the substrate 101 to maintain a planar surface, i.e., flatness, of the substrate 101 with the showerhead faceplate 118 of the showerhead assembly 112. Additionally, the controller 198 may halt the processing of the substrate 101 if the metrics from the sensor assembly 170 indicates that the processing parameters are outside of target values or damage to the processing chamber 100 or substrate 101 is likely to occur. The controller may also adjust the faceplate 118 of the showerhead assembly 112 to properly align with the substrate 101.

The faceplate 118 may be attached to the diffuser plate 116 by a plurality of actuators 150. The actuators 150 may be linear actuators, a parallel-kinematic precision positioning systems such as a hexapod, or other suitable actuator. The actuators 150 may move independently from one another to orient the bottom surface 152 of the faceplate 118. For example, one or more actuators 150 may extend when other actuators 150 retract to orient a plane of the bottom surface 152 of the faceplate 118 to be substantially parallel with a plane of the substrate 101 disposed on the substrate support 126. Alternately, one or more actuators 150 may be attached to the substrate support 126 for orienting the support surface 130 into a position wherein a plane of the substrate 101 disposed on the support surface 130 is substantially parallel to a plane of the faceplate 118.

Turning briefly to FIGS. 5 and 6, example embodiments are illustrated for the showerhead having actuators 150. FIG. 5 illustrates one embodiment for the showerhead assembly 112 having actuators 150 for adjusting the position of the showerhead assembly 112 within the processing chamber 100. The disk shaped body 119, of the faceplate 118 in the showerhead assembly 112, has an outer perimeter 518. The actuators 150 may be disposed along the outer perimeter 518. The disk shaped body 119 may have a first actuator 551 disposed at one end and a second actuator 552 disposed at an opposite end. Each actuator 150 may be moveable in a vertical between an upward direction shown by arrow 520 and a downward direct shown by arrow 510. Imaginary line 530 illustrates a plane of the substrate 101 (not shown). Sensor assemblies 170 may indicate the distance of the bottom surface 152 from the substrate 101. The first actuator 501 coordinates with the second actuator 502 moving in either an upward (520) or downward (510) direction to place the bottom surface 152 in a parallel orientation with the imaginary line 530 indicative of the plane of the substrate 101. As the plane of the substrate 101 indicated by the imaginary line 530 may be different for each or subsequent substrate 101 undergoing processing in the processing chamber 100, the imaginary line 530 indicative of the plane of the substrate 101 may be determined by measuring the gap 190 with the sensor assembly 170 and adjusting the first and second actuator 551, 552 to orient the bottom surface 152 of the faceplate 118 parallel with the substrate 101.

FIG. 6 illustrates another embodiment for the showerhead assembly 112 having actuators 150 for adjusting the position of the showerhead assembly 112 within the processing chamber 100. The faceplate 118 of the showerhead assembly 112 may have a stem 618 along a centerline 690 of the faceplate 118. A plurality of actuators 150 may attach the stem 618 a showerhead mount 622 disposed on the diffuser plate 116. A first actuator 651 may be disposed opposite a second actuator 652 for adjusting an inclination of the bottom surface 152 of the faceplate 118. For example, the first actuator 651 may adjust upwards 611 for increasing a first gap at location 601 while the second actuator 652 adjust downwards 613 for decreasing a second gap value at 602. The sensor assembly 170 may measure the gap 190 along the length of the bottom surface 152 and provide the values to the controller for adjusting the actuators accordingly 150 and thus, establishing the bottom surface 152 parallel with the substrate 101.

Figure 7:
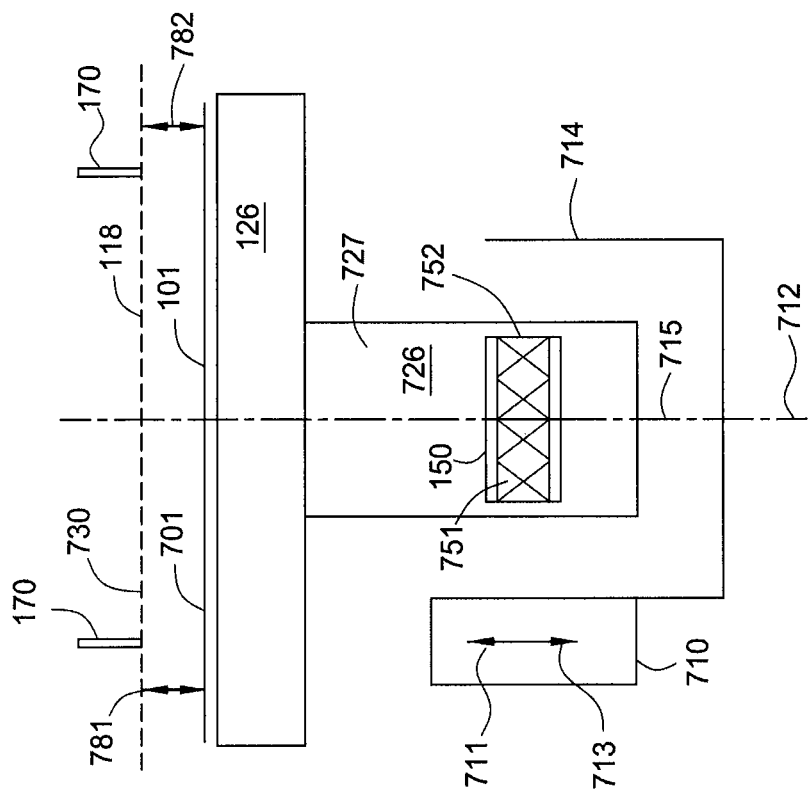
FIG. 7 illustrates one embodiment for the substrate support having actuators for adjusting the position of the substrate support within the processing chamber.

FIG. 7 illustrates one embodiment for the substrate support 126 having actuators 150 for adjusting the position of the substrate support 126 within the processing chamber 100. The substrate support 126 is disposed on a stem 726. The stem 726 may be disposed along a centerline 790 of the substrate support 126. A plurality of actuators 150 may attach the stem 726 to a support mount 714. The support mount 714 may be attached to a lift 710 operable to move the entire substrate support 126 upward 711 and downward 713. A portion 715 of the support mount 714 may extend to an interior 727 of the stem 726. The actuators 150 moveably connect the stem 726 supporting the substrate support 126 to the support mount 714. The actuators 150 may include a plurality of actuators, such as a first actuator 751 and a second actuator 752. The first and second actuator 751, 752 may attach opposite sides of the portion 715 of the support mount 714 to the stem 726. The first and second actuator 751, 752 may operate along a plurality of axis. For example, the first and second actuator 751, 752 may be a hexapod positioner operable along six different axes of movement for adjusting the alignment of the substrate support 126. For example, the first actuator 751 may adjust upwards 711 for increasing a first gap at location 781 while the second actuator 752 adjust downwards 713 for decreasing a second gap value at location 782. The sensor assembly 170 disposed in the faceplate 118 may measure the gap 190 along the length of the bottom surface 152, such as the value of the first and second gap at locations 781, 782, and provide the values to the controller for adjusting the first and second actuator 751, 752 to establishing a parallel orientation between the substrate 101 disposed on the substrate support 126 and the faceplate 118.

Figure 8:
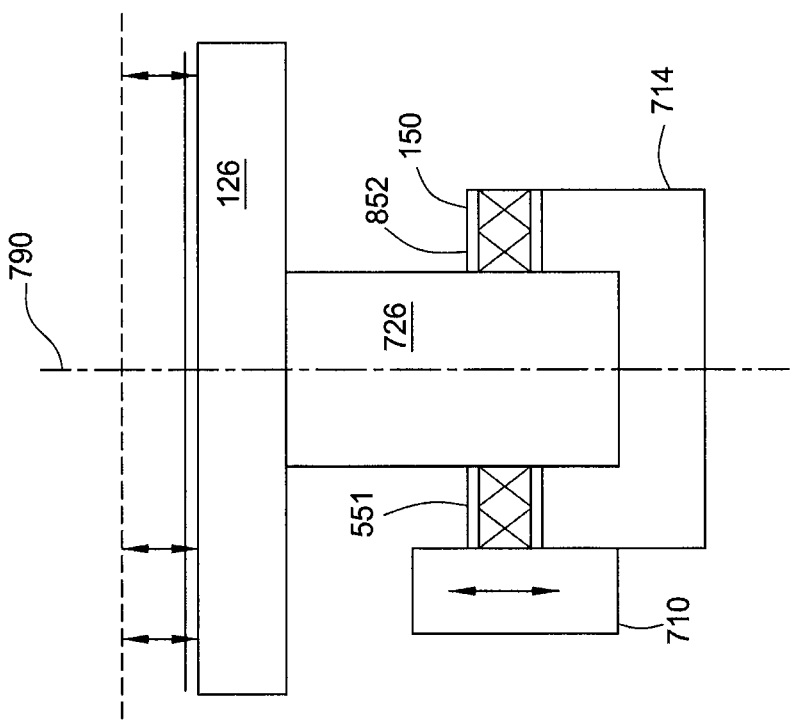
FIG. 8 illustrates another embodiment for the substrate support having actuators for adjusting the position of the substrate support within the processing chamber.

FIG. 8 illustrates another embodiment for the substrate support 126 having actuators 150 for adjusting the position of the substrate support 126 within the processing chamber 100. The lift 710 is similarly attached to the mounting hub 741. However, in this embodiment the actuators 150 are disposed between an diameter 826 of the stem 726 and the mounting hub 741. There may be a two or more actuators 150, such as four actuators 150 operable between the stem 726 and the mounting hub 741. For example, a first actuator 851 and a second actuator 852 may operate to adjust the substrate support 126 to align in a parallel fashion the substrate 101, disposed thereon, and the faceplate 118.

It is also contemplated that the sensor assembly 170 disposed in the processing chamber 100 can be extended to manufacturing of other products where information relating to deflection of a workpiece being processed is desirable in nanometers or at the microns level. The operating parameters may then be controlled with a feedback loop relying on the data provided by the sensor assembly 170 for improved process control in the production of said products.

Figure 2:
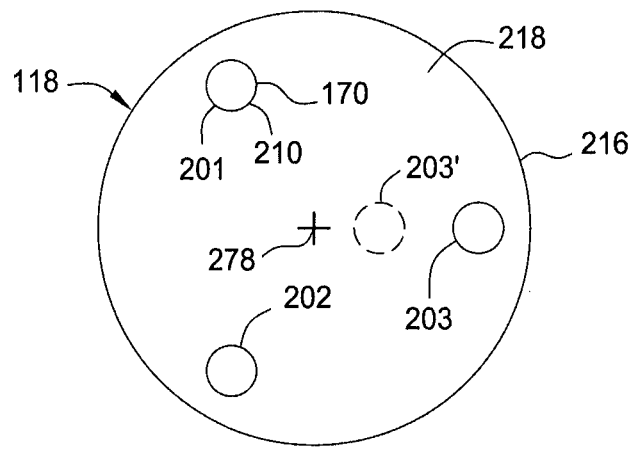
FIG. 2 is a bottom plan view for the showerhead having sensor assemblies spaced according to one embodiment.

Referring now additionally to FIG. 2, the faceplate 118 and the locations for the sensor assembly 170 will now be discussed. FIG. 2 is a bottom plan view for the faceplate 118 having sensor assemblies 170 spaced across a bottom surface 218 of the faceplate 118. The bottom surface 218 is configured to be exposed to the processing region 142 of the processing chamber (i.e., facing the substrate 101) and substantially parallel to the support surface 130 of the substrate support 126.

The faceplate 118 has a plurality of gas holes 136 (shown in FIG. 1). The faceplate 118 has one or more sensor mounting holes 210. The sensor assembly 170 is mounted in the sensor mounting holes 210 of the faceplate 118. Alternately, the sensor assembly 170 may be mounting in gas holes 136. This alternate arrangement for the sensor assembly 170 location is discussed further below with respect to FIG. 9. The shape of the sensor mounting hole 210 is not limited to circular holes. For example, the sensor mounting holes 201 may be conical, square or other shape suitable to receive the sensor assembly 170 therein. The sensor mounting holes 210 can be laser drilled, machined or formed in another suitable manner such as 3D printing. In one embodiment, the sensor assembly 170 is placed in an existing in-situ microscope (ISM) port of the faceplate 118. In another embodiment, one or more of the gas holes 136 are configured as the sensor mounting hole 210 for accepting the sensor assembly 170.

In one embodiment, the faceplate 118 has three sensor mounting holes 210, each hole 210 receiving a respective one of the sensor assemblies 170. The sensor mounting holes 210 formed in the faceplate 118 are also labeled as a first sensor mounting hole 201, a second sensor mounting hole 202, and a third sensor mounting hole 203. Each of the first, second, and third sensor mounting holes 201, 202, 203 may be similarly configured to accept the sensor assembly 170. The first, second, and third sensor mounting holes 201, 202, 203 may be equidistantly spaced. For example, the first, second, and third sensor mounting holes 201, 202, 203 may be equally spaced about a center 278 of the faceplate 118 on a common radius. The center 278 of the faceplate 118 is aligned with a center of the substrate support 126, and thus also aligned with a center of the substrate 101. The first, second, and third sensor mounting holes 201, 202, 203 may be positioned proximate an outer perimeter 216 of the faceplate 118. Alternately, a third sensor mounting hole 203' may be positioned closer to the center 278 then the first, second sensor mounting holes 201, 202. In this manner, sensors disposed therein may be able to detect differences in the gap 190 at different radii from the center 278 to the outer perimeter 216.

The location of the first, second, and third sensor mounting holes 201, 202, 203 may be arranged such sensor assemblies 170 disposed therein, can detect the orientation of a surface of the substrate 101 opposite the faceplate 118 when measuring the gap 190. For example, three sensor assemblies 170 mounted in respective first, second, and third sensor mounting holes 201, 202, 203 may be able to determine a plane of the substrate surface and compare the determined inclination of the plane of the substrate surface relative to that of a desired or target plane of the substrate surface, which generally is desired to be parallel to the support surface 130 of the substrate support 126 and perpendicular to the center line of the substrate support 126. Should the surface of the substrate not reside in the target plane, the control system 198 can determine that the substrate may not be loaded properly, is bent, is moving or vibrating, or is otherwise not ideally situated for processing. The control system 198 may stop processing or issue a warning signal, such as an alarm, email, electronic notification and the like, in response to determining that the substrate 101 does not reside in the target plane.

As discussed above, the sensor assembly 170 may be disposed in a through hole formed in the faceplate 118, such as the gas holes 136. The sensor assembly 170 may be porous and allow fluid, such as the process gases, to traverse therethrough. For example, the sensor assembly 170 may have passages that permit process gases to pass through the sensor assembly 170. Turning to FIG. 9, FIG. 9 is a partial cross-sectional view of the faceplate 118 shown in FIG. 1 having the sensor assembly 170 mounted in the gas hole 136. A vertical line 998 is provided along a center of the gas hole 136. The vertical line 998 is merely illustrative to show orientation. The shape of the gas hole 136 in which the sensor assembly 170 is mounted in the faceplate 118 is not limited to circular holes. The hole can be laser drilled, machined or formed in another suitable manner.

The sensor assembly 170 includes a sensor 980 and a sensor housing 920. The sensor 980 may be a fiber optic based sensors, such as a Fabry-Pérot sensor (FPS), or interferometer, or other sensor suitable for measuring small deflections. In one embodiment, the sensor 980 is an FPS. The sensor 980 communicates with the control system. In one embodiment, the sensor 980 may have communication connections 984 hardwired to the controller. Alternately, the sensor assembly 170 may communicate wirelessly with the control system. The sensor 980 may measure a metric indicative of a distance to the substrate 101 (not shown) disposed on the substrate support 126 and provide the metric to the control system in real-time for analysis to ensure the processes integrity is maintained.

Figure 13B:
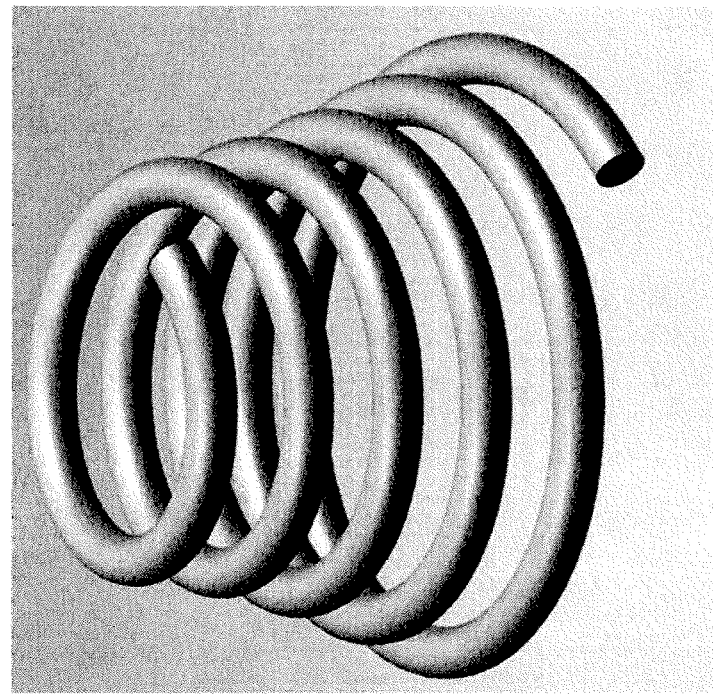
FIGS. 13A through 13B are example springs.
Figure 13A:
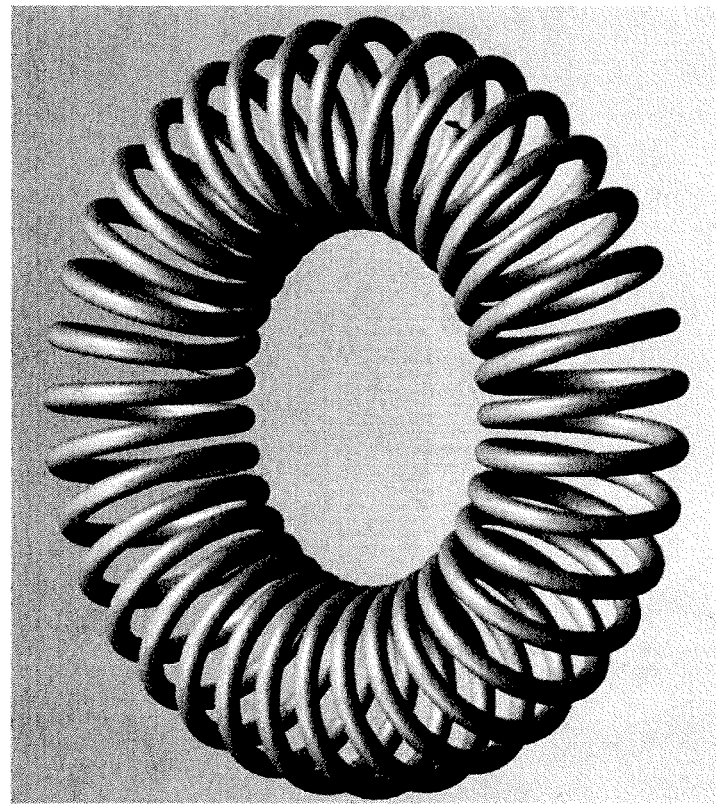

The sensor 980 may have a sensor head 982. The sensor head 982 may emit and receive signals for making distance measurements. The sensor 980 may be precision mounted in the faceplate 116 such that a distance between the sensor head 982 and any object, such as the substrate (not shown), can be measured in real-time to determine relative displacement with nanometer accuracy. The sensor 980 may be precisely mounted within a transition conduit 910 of the gas hole 136. Example configurations of the sensor head 982 are shown in FIGS. 12A through 12C. The sensor head 982 may have a suitable shape to interface with a spring, such as conical spring 943 or donut coil spring 942 shown in FIGS. 13A though 13B.

The sensor housing 920 holds the sensor 980 in the gas hole 136. The sensor head 982 may be aligned within +/−3 degrees of the vertical line 998, or in other words, +/−3 degrees from a perpendicular of the substrate support 126. The distance of the sensor head 982 can be precisely adjusted from about less than 5 mm to about 300 mm from the bottom surface 152 of the faceplate 116.

The sensor 980 may include a radiation emitter to emit radiation and a radiation detector to measure the portion of the radiation reflected by the substrate 101. The radiation, or signal, may be, for example, electromagnetic radiation having a wavelength between about 600 nanometers and about 1700 nanometers. The radiation detector in the sensor 980 measures the return path for the radiation signal emitted. Thus, the angle and location of the sensor 980 may affect the measurement. The sensor housing 920 holds the sensor 980 in a precise location and orientation for facilitating accurate measurements.

Figure 10A:
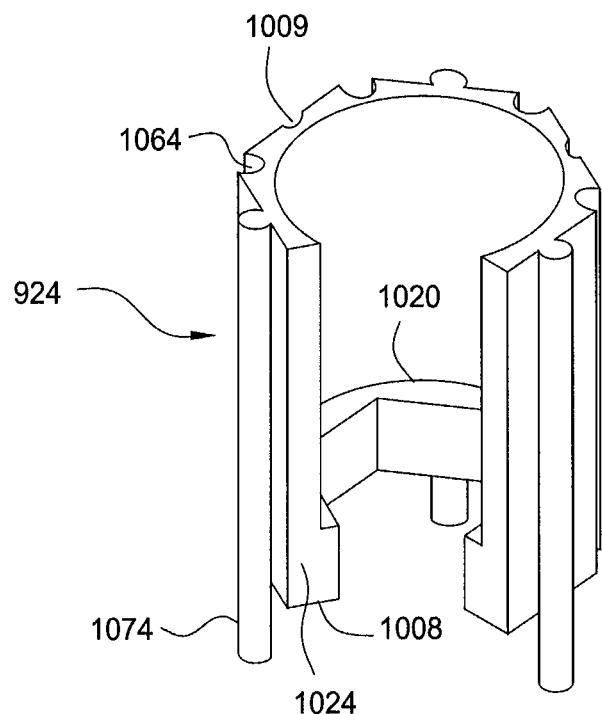
FIG. 10A is a isometric view of a split plate of a conical spring mount.
Figure 10B:
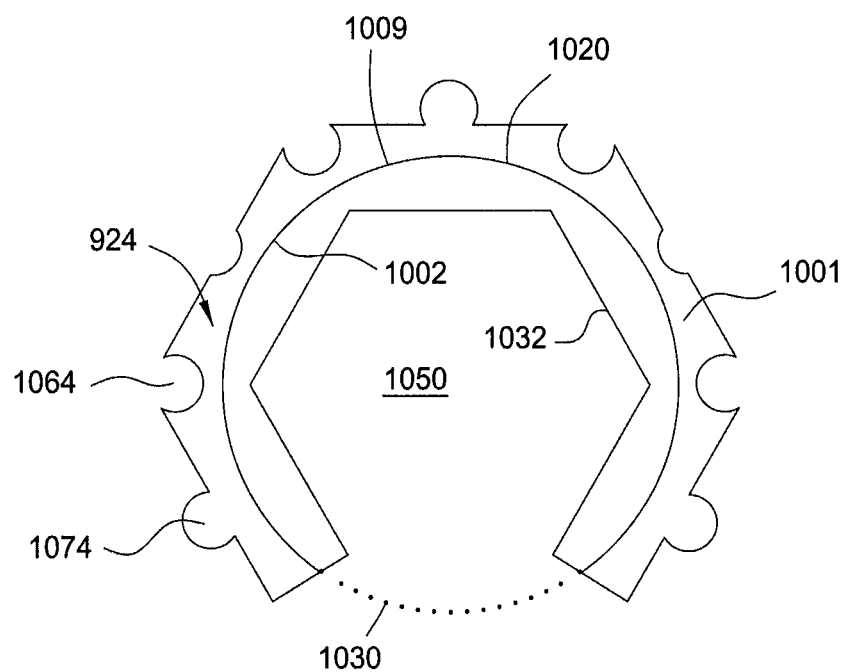
FIG. 10B is a plan view of the conical spring mount.
Figure 11:
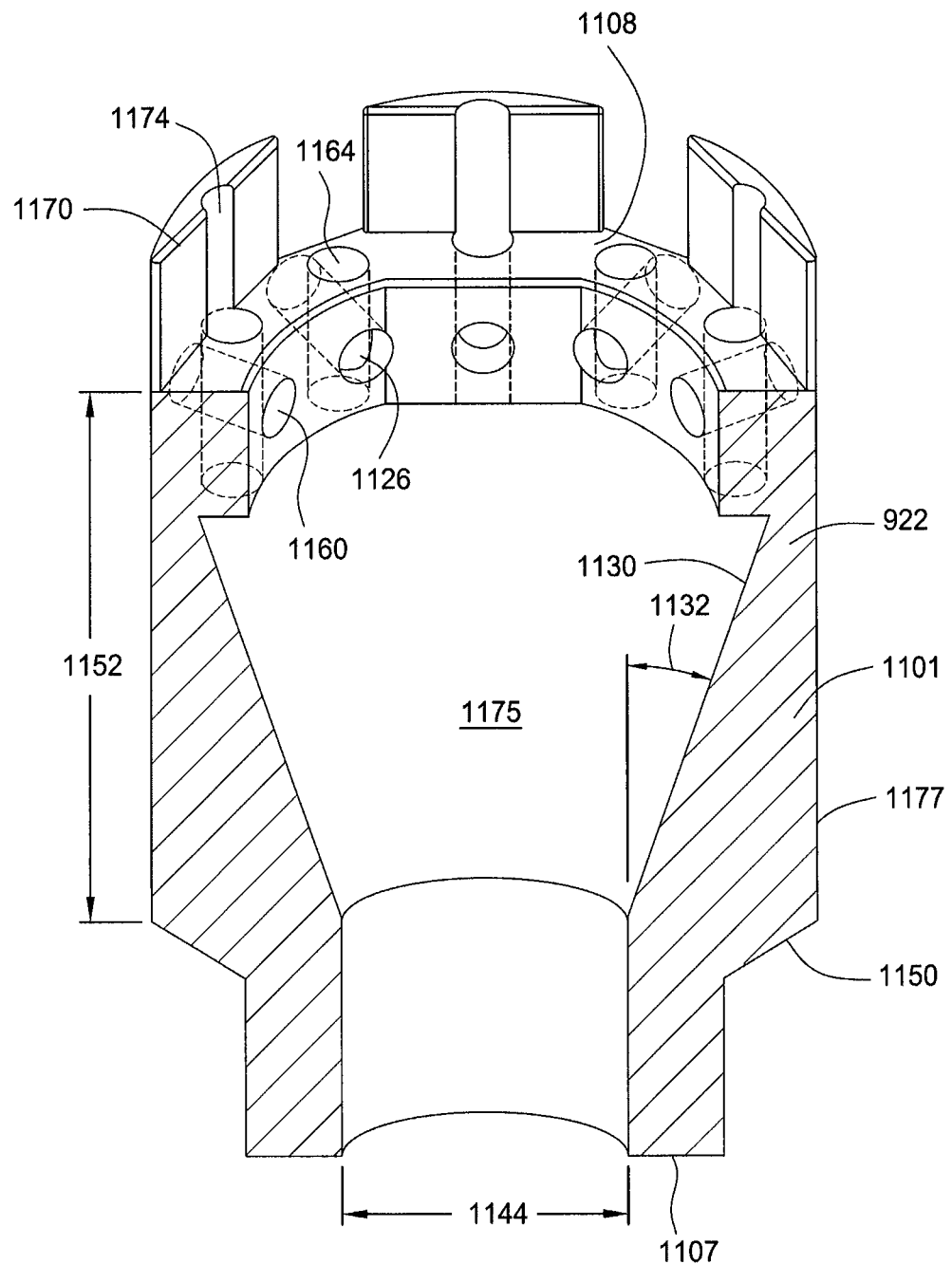
FIG. 11 is a cross-sectional perspective view of a mounting head of the sensor housing.

The sensor housing 920 may include a conical spring mount 922 and a mounting head 924. The conical spring mount 922 and mounting head 924 are discussed here with additional reference made to FIGS. 10A, 10B and 11. FIG. 10A is a prospective view of the conical spring mount 922 for the sensor assembly 170. Self-alignment of the sensor 980 can be achieved with the conical mounting head 924 in conjunction with the conical spring mount 922. FIG. 10B is a plan view for the conical spring mount 922. FIG. 11 is a cross-sectional view for the mounting head 924 of the sensor assembly 170.

The mounting head 924 and conical spring mount 922 may both be formed from a polymer suitable for low temperature operations. Alternately, the mounting head 924 and conical spring mount 922 may be formed from a ceramic or metal material suitable for either high or low temperature applications. The mounting head 924 and conical spring mount 922 may be made of metal such as stainless steel (SST), titanium, aluminum, tungsten, nickel or other alloy. Alternately, the mounting head 924 and conical spring mount 922 may be made of a ceramic material such as alumina or aluminum nitride, or quartz. The mounting head 924 and conical spring mount 922 can also be 3D printed either in a metal or ceramic material.

The sensor housing 920 is configured to allow gas to flow through the sensor assembly 170. The sensor housing 920 may be porous. The mounting head 924 and conical spring mount 922 may both be porous and may additionally or alternately have multiple holes or slots to allow the gas to flow therethrough. For example, as shown in FIG. 11, the mounting head 924 has holes 1126, 1164 for allowing gas to pass through the sensor assembly 170. Additionally, as shown in FIGS. 4A and 4B, the conical spring mount 922 has a plurality of holes 1064. The holes 1164 in the conical spring mount 922 align with the holes 1164 in the mounting head 924 to promote fluid to flow through the sensor assembly 170. The holes 1126, 1164 may extend through the mounting head 924. The mounting head 924 and conical spring mount 922 may be precision machined with the holes 1126, 1164, such as 4 or more, along a peripherally to allow the gas to flow through the sensor assembly 170. Alternately, the plurality of holes 1126 may be formed in the mounting head 924 and conical spring mount 922 during an additive manufacturing process such as 3D printing. The number of holes 1126, 1164, can range from about 1 to about 100 or more to adjust the conductance of the fluid flowing therethrough. Alternatively, the sensor housing 920 may be formed from a porous material, such as porous ceramic, to further improve the gas flow when the sensor 980 is mounted in the gas holes 136 or other through holes.

Turning briefly to FIGS. 10A and 10B, the mounting head 924 has a body 1001. The body 1001 may be ringed shaped. The body 1001 may optionally have a side opening 1030. The body 1010 has a central opening 1050. In one embodiment, the body 1001 is a hexagonal ring with one facet of the hexagon missing to form the side opening 1030. In another embodiment, the body 1001 may have a circular ring shape, having a segment of the body 1001 missing to effectively form the side opening 1030.

The central opening 1050 may have an inner perimeter 1002. The central opening 1050 may have an inner ledge 1020 extending from the inner perimeter 1002 into the central opening 1050. The inner ledge 1020 may have an inner perimeter 1032. The inner perimeter 1002 of the central opening 1050 is sized to allow the sensor 980 to pass therethrough. The inner perimeter 1032 of the inner ledge 1020 is smaller than the inner perimeter 1002 of the central opening 1050. The inner perimeter 1032 of the inner ledge 1020 is also smaller than the width of the sensor 980 such that the sensor 980 may be supported by the inner ledge 1020. In this manner, the position of the sensor 980 in the mounting head 924 may be configured to precisely arrange the sensor 980 within the gas holes 136.

The body 1001 of the mounting head 924 has a plurality of holes 1064. The holes 1064 extend from the top surface 1009 to the bottom surface 1008. In one embodiment, the mounting head 924 has 4 holes 1064. In another embodiment, the mounting head has 6 or more holes 1064. The holes 1064 are configured to permit fluid to flow past the body 1001 of the mounting head 924 when the sensor assembly 170 is mounted in the gas holes 136. Advantageously, the sensor assembly 170 may be installed inside an existing fluid delivery hole in a conventional electrostatic chuck, thus allow a retrofit of an existing electrostatic chuck without the sensor assembly 170 interfering with the flow of fluid through the hole accommodating the sensor assembly 170.

The body 1001 of the mounting head 924 additionally has one or more pins 1074. The pins 1074 extend from the top surface 1009 past the bottom surface 1008. In one embodiment, the mounting head 924 has three pins 1074 for interfacing with and locating the mounting head 924 in the conical spring mount 922.

Turning briefly to FIG. 11, the conical spring mount 922 has a plurality of receiving holes 1174. The receiving holes 1174 in the conical spring mount 922 accept the pins 1074 from the mounting head 924. Thus, the conical spring mount 922 may be aligned with the mounting head 924 in a predetermined manner.

The conical spring mount 922 has a body 1101. The body 1101 may have a bottom surface 1107 and a top surface 1108. The body 1101 may be ring shaped and have an interior opening 1175 extending from the bottom surface 1107 to the top surface 1108. A plurality of fins 1170 may extend above the top surface 1108. The fins 1170 provide stability to the joint between the conical spring mount 922 and the mounting head 924. Additionally, the fins 1170 may assist aligning the pins 1074 in the mounting head 924 with the receiving holes 1174 in the conical spring mount 922.

The body 1101 may have a plurality of passageways 1160, i.e. holes 1126, 1164, which extend through the body 1101. The passageways 1160 may align with the holes 1064 in the mounting head 924. Thus, the combination of passageways 1160 and holes 1064 provide a continuous conduit for the fluid to flow across the sensor housing 920 and thus through the sensor assembly 170. In one example, a fluid enters the interior opening 1175 at the bottom 1107 of the conical spring mount 922. The fluid moves upwardly through the conical spring mount 922 towards the top surface 1108. The fluid enters the passageways 1160 formed in the conical spring mount 922 and is directed into and past the holes 1064 of the mounting head 924. The fluid leaves the holes 1064 at the top surface 1009 of the mounting head 924 and continues up the gas holes 136 to the substrate support surface 172. Thus, the combination of passageways 1160 and holes 1064 together allow fluid to pass through the sensor assembly 170.

The body 1101 of the conical spring mount 922 is configured to interface with the transition conduit in the gas hole 136 without interfering with the fluid flowing therethrough the gas hole 136. The body 1101 has an inner diameter 1144 at the bottom surface 1107. The inner diameter 1144 extends upward toward the top surface 1108. The inner diameter 1144 transitions at an angle 1132 to an inclined interior surface 1130. The inclined interior surface 1130 may extend outwardly from the inner diameter 1144 at the angle 1132 toward the top surface 1108. The angle 1132 and inclined interior surface 1130 may be configured to effect properties of the fluid flow, such as fluid conductance, pressure or velocity.

The body 1101 may additionally have a chamfer 1150 on the outer surface 1177. The chamfer 1150 may be angled to form a press fit between the conical spring mount 922 and transition conduit 910. The chamfer 1150 may be a prescribed distance 1152 from the top surface 1108. The distance 1152 may be made to any size to accommodate need. For instance, the distance 1152 may be sized by forming the body 1101 with a longer or shorter distance 1152 between the chamfer 1150 and the top surface 1108. Alternately, the body 1101 may be formed in two sections with a first section containing the top surface 1108 and the second section containing the chamfer 1150. The sections may be joined together in an manner such as screwing the sections together, using a combination steps and landings, or using another suitable manner which allow the distance 1152 to be modified. Advantageously, the sensor head 982 can be precisely adjusted upward toward or downward from about less than 5 mm to about 30 mm away from the bottom surface 152 of the faceplate 118.

Figure 3:
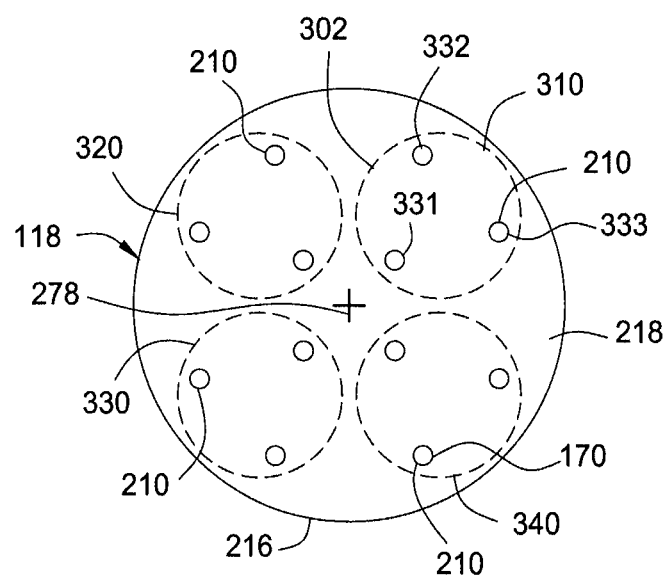
FIG. 3 is a bottom plan view for the showerhead having sensor assemblies spaced according to another embodiment.

Referring now additionally to FIG. 3 along with FIG. 1, a second embodiment of the faceplate 118 having different locations for the sensor assembly 170 will now be discussed. FIG. 3 is a bottom plan view for the faceplate 118 having sensor assemblies 170 spaced according to the second embodiment.

The faceplate 118 has the sensor mounting holes 210 arranged in regions 302 (illustratively shown by the dotted line). The dotted line representing the regions 302 may similarly represent the outer perimeter of the substrate 101 for which the region 302 is associated with. Each region 302 has one or more sensor assemblies 170 for measuring the gap 190 at the substrate 101 situated in the respective region 302. The size and shape of the region 302 is merely illustrative and may be configured to correspond to one or more substrates. In one embodiment, each region 302 corresponds to and representative of a single substrate 101.

The faceplate 118 may have a first region 310 of the regions 302 with one or more sensor mounting holes 210 disposed therein, each sensor mounting hole 210 retaining a respective one of the sensor assemblies 170. For example, the first region 310 may have a first mounting hole 331 configured to support and receive the first sensor assembly 170. The first region 310 may have a second mounting hole 332 configured to support and receive the second sensor assembly 170. The first region 310 may also have a third mounting hole 333 configured to support and receive the third sensor assembly 170. The first region 310 may have additional sensor mounting holes 210 as needed or desired. The sensor mounting holes 210, such as the first second and third mounting holes 331, 332, 333 may be configured within the first region 310 in arrangement similar to those discussed in FIG. 2. The arrangement of the sensor assemblies 170 disposed in sensor mounting holes 210 about the first region 310 may be configured to detect a metric indicative of the gap 190 at different locations along the substrate 101.

The faceplate 118 may have a second region 320 of the regions 302 continuing sensor mounting holes 210. The second region 320 may have sensor assemblies 170 disposed in the sensor mounting holes 210. The sensor assemblies 170 are configured to measure the gap 190 along a second substrate corresponding to the second region 320. The faceplate 118 may have a third region 330 of the regions 302 containing sensor mounting holes 210. The third region 330 has sensor assemblies 170 disposed in the sensor mounting holes 210. The sensor assemblies 170 measure the gap 190 along a third substrate corresponding to the third region 330. The faceplate 118 may have a fourth region 340 of the regions 302 containing sensor mounting holes 210. The fourth region 340 has sensor assemblies 170 disposed in the sensor mounting holes 210. The sensor assemblies 170 measure the gap 190 along a fourth substrate corresponding to the fourth region 340. Thus, it is possible to configure the faceplate 118 with regions corresponding to the number of substrates 101 in which the substrate support 126 is configured to support. In one embodiment, the substrate support 126 is configured to support 3 substrates 101 and the faceplate 118 has three regions 302.

Figure 4:
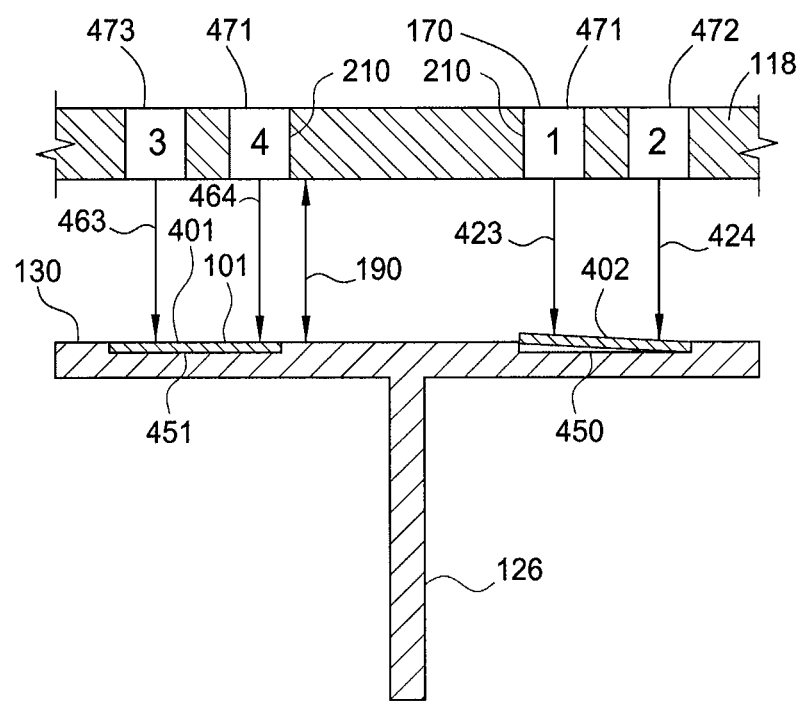
FIG. 4 is schematic side view for an interior portion of the processing chamber.

FIG. 4 is schematic side view for an interior portion of the processing chamber 100 and may be referred to facilitate discussion of the operation of the sensor assemblies 170. Shown is a portion of the faceplate 118 and the substrate support 126. The substrate support 126 is configured to support more than one substrate 101. In one embodiment, the substrate support 126 supports two substrates. A first substrate receiving pocket 451 is formed on the support surface 130 of the substrate support 126. The first substrate receiving pocket 451 is configured to hold a first substrate 401 therein. A second substrate receiving pocket 450 may also be formed on the support surface 130 of the substrate support 126. The second substrate receiving pocket 450 is configured to hold a second substrate 402 therein.

The faceplate 118 has a plurality of sensor assemblies 170. The sensor assemblies 170 may be a fiber optic based sensors, such as a Fabry-Pérot sensor (FPS), laser sensor, or interferometer, or other sensor suitable for measuring small (microns) distances from which substrate deflections may be derived. In one embodiment, the sensor assemblies 170 are laser sensors. The sensor assemblies 170 communicate with the control system 198. The sensor assemblies 170 may communicate via a wired or wireless connection to the control system 198. The sensor assemblies 170 may include an optical fiber and an external sensor. The optical fiber may be used to guide the laser signal from the external sensor to inside processing chamber, or from the processing chamber/substrate to the detector. The sensor assemblies 170, mounted in the faceplate 118, output a metric indicative of a distance to the substrate (i.e. the gap 190) disposed on the substrate support 126. The sensor assemblies 170 may provide the metric to the control system 198 in real-time for analysis and process control. The sensor assemblies 170 provide the measure of the gap 190 to the substrate 101 indicative of curvature, misalignment, wobbling, or other defect inducing indicators. For example, the sensor assemblies 170 may identify the gap 190 in between substrate and the faceplate 118 at multiple points along the faceplate 118 and substrate 101. The sensor assemblies 170 provide real time feedback, which assist in troubleshooting the processing uniformity issues on the substrate 101. The multiple locations for the sensor assemblies 170 may be arranged in positions relative to the center of the substrate 101, such as between about 3 mm to about 5 mm from an edge of the substrate 101 illustrated by the regions 302 illustrated in FIG. 3. The different locations for the sensor assemblies 170 which interface with a single substrate 101 allow the planar orientation of the substrate 101 to be derived.

The faceplate 118 is shown with four sensor assemblies 170. Each pocket 450, 451 in the substrate support 126 may have two or more sensor assemblies 170. For example, the second substrate receiving pocket 450 has a first sensor 471 and a second sensor 472. The first and second sensors 471, 472 may be aligned within +/−3 degrees from perpendicular to the bottom surface 218 of the faceplate 118. The first and second sensors 471, 472 measure a substantially perpendicular distance from the faceplate 118 detecting the gap 190 to the second substrate 402 in the second substrate receiving pocket 450. Likewise, the first substrate receiving pocket 451 has a third sensor 473 and a fourth sensor 474. The third and fourth sensor 473, 474 may be aligned within +/−3 degrees from perpendicular to the bottom surface 218 of the faceplate 118. The third and fourth sensor 473, 474 measure a substantially perpendicular distance from the faceplate 118 detecting the gap 190 to the first substrate 401 in the first substrate receiving pocket 451.

In some embodiments, the substrate support 126 rotates during processing. The substrate 101 not completely or properly residing one of the pockets 450, 451 often leads to serious damage to the substrate 101, processing chamber 100 and/or the faceplate 118. As the sensor assemblies 170 detects when the substrate 101 is out of pocket in real time, damage to the substrate and processing chamber downtime is greatly diminished.

The sensor assemblies 170 may also detect substrate 101 hand off problems and provide real time feedback. For example, the third sensor 473 provides feedback of a third measure 463. The fourth sensor 474 provides feedback of a fourth measure 464. The third and fourth measures 463, 464 may be compared to a predictive measure for determining a state of the first substrate 401 in the second substrate receiving pocket 450. An indication that the third and fourth measures 463, 464 are the substantially same and within a predetermined range may be indicative that the first substrate 401 is properly seated in the second substrate receiving pocket 450 and the planar orientation of the substrate 401 is within tolerance for processing.

The sensor assemblies 170 may also detect substrate 101 bowing or misalignment in real time. Additionally, the sensor assemblies 170 may detect misalignment of the faceplate 118 and/or the substrate support 126. For example, the first sensor 471 provides feedback of a first measurement 461. The second sensor 472 provides feedback of a second measurement 462. The first and second measurements 461, 462 may be compared to a predictive measure for determining a state of the second substrate 402 situated in the first substrate receiving pocket 451. An indication where the first and second measurements 461, 462 are the substantially different or outside a predetermined range may be indicative that the second substrate 402 is misaligned in the first substrate receiving pocket 451 or the flatness is outside of tolerance for processing. Additionally, the first and second measurements 461, 462 may measure deflection or bowing of the substrate. For example, the gap 190 may be measured in a center location and compared to the measure of the gap 190 along an outer perimeter of the substrate. The sensor assemblies 170 measure the gap 190 between the faceplate 116 and the substrate 101 at a plurality of locations. The gap 190 may indicate the flatness of the substrate 101 and the proximity of the substrate 101 to the faceplate 116. The sensor assemblies 170 may measure changes in the gap 190 to the substrate 101 over short time intervals. The control system 198 may be able to detect vibration in the substrate 101 using the real-time measurement of the gap 190 from the sensor assemblies 170 and comparing each subsequent measurement. Upon the control system 198 determining the substrate is moving, the control system 198 may halt processing the substrate. Advantageously, the control system 198 can minimize film stress in the substrate 101.

The substrate in the processing chamber may be monitored by providing one or more signals from the one or more sensor assemblies to a control system. The one or more sensor assemblies are disposed in the faceplate disposed in the processing chamber. The one or more signals may include a metric indicative of the distance between the faceplate and the substrate disposed on the substrate support assembly below the faceplate. The metric may determine if the distance between the faceplate and the substrate is outside of a target window. Having the metric for the substrate outside the target window may generate at least one of an alarm, adjusting a substrate fabrication process or stopping a substrate fabrication process in response to the distance between the faceplate and the substrate is outside of a target window. For example, the metric may be indicative of the planar orientation of the substrate being outside of a process window. In another example, the metric may be indicative of the substrate vibrating.

Advantageously, the sensor assembly described herein helps prevent bowing, misalignment and process uniformity of the substrate disposed on the substrate support by monitoring the gap between the substrate and the faceplate. Preventing bowing of the substrate reduces film stress during manufacturing. Additionally, preventing misalignment of the substrate minimizes damage to both chamber equipment and expensive substrates.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A faceplate configured to introduce processing gases into a plasma processing chamber, the faceplate comprising:
   a disk shaped body having first holes formed through the body; and
   a first sensor assembly disposed in one of the first holes, the first sensor assembly having second holes in the first sensor assembly, the second holes being configured to permit a gas to flow through the second holes and the one of the first holes in which the first sensor assembly is disposed, the first sensor assembly further comprising:
a sensor configured to provide a metric indicative of a distance defined between a substrate support and the first sensor assembly.

2. The faceplate of claim 1 further comprising:
at least a second sensor assembly and a third sensor assembly disposed in respective ones of the first holes through the body, the second and third sensor assemblies operable to provide a metric indicative of a distance that a substrate is positioned below the faceplate.

3. The faceplate of claim 2, wherein the sensor assemblies are disposed at different distances from a center of the body.

4. The faceplate of claim 2, wherein the first, second and third sensor assemblies are disposed in a first region of the body, and wherein a second region of the body includes additional sensor assemblies that are operable to provide a metric indicative of a distance that a substrate is positioned below the faceplate.

5. The faceplate of claim 1, wherein the first sensor assembly is operable to communicate wirelessly with a control system.

6. The faceplate of claim 1, wherein the sensor is aligned within +/−3 degrees from perpendicular to a surface of the body configured to face a substrate support.

7. The faceplate of claim 1, wherein the sensor is assembly a laser sensor.

8. The faceplate of claim 1, wherein the sensor is a Fabry-Perot sensor.

9. The faceplate of claim 1, wherein the first sensor assembly comprises a sensor housing, the sensor housing comprising:
a conical mount having alignment holes; and
a mounting head mated to the conical mount, the mounting head having alignment pins, the alignment pins being inserted in respective ones of the alignment holes, the sensor being disposed in the conical mount and mounting head, the second holes being through the conical mount.

10. A faceplate configured to introduce processing gases into a plasma processing chamber, the faceplate comprising:
a disk shaped body;
a plurality of holes formed through the body; and
a first sensor assembly disposed in one of the plurality of holes, the first sensor assembly comprising:
a fiber optic based sensor configured to provide a metric indicative of a distance defined between a substrate support and the first sensor assembly.

11. The faceplate of claim 10 wherein the fiber optic based sensor is a Fabry-Pérot sensor.

12. The faceplate of claim 10, wherein the first sensor assembly has second holes in the first sensor assembly, the second holes being configured to permit a gas to flow through the second holes and the one of the plurality of holes in which the first sensor assembly is disposed.

13. The faceplate of claim 12, wherein the first sensor assembly comprises a sensor housing, the sensor housing comprising:
a conical mount having alignment holes; and
a mounting head mated to the conical mount, the mounting head having alignment pins, the alignment pins being inserted in respective ones of the alignment holes, the sensor being disposed in the conical mount and mounting head, the second holes being through the conical mount.

14. The faceplate of claim 10 further comprising:
a second sensor assembly; and
a third sensor assembly, wherein the second sensor assembly and the third sensor assembly are disposed in respective ones of the plurality of holes through the body, the second and third sensor assemblies operable to provide a metric indicative of a distance that a substrate is positioned below the faceplate.

15. The faceplate of claim 14, wherein the first sensor assembly, the second sensor assembly, and the third sensor assembly are disposed at different distances from a center of the body.

16. The faceplate of claim 10, wherein the first sensor assembly is operable to communicate wirelessly with a control system.

17. An apparatus comprising:
a faceplate comprising a disk shaped body having body holes formed through the body, the faceplate being configured for a semiconductor processing chamber; and
a first sensor assembly comprising:
a sensor housing engaged with the body in a first body hole of the body holes, the sensor housing having a housing hole, the housing hole being configured to permit a fluid to flow through the housing hole and the first body hole with the sensor housing engaged with the body; and
a sensor disposed in the sensor housing and configured to provide a metric indicative of a distance defined between a surface and the first sensor assembly.

18. The apparatus of claim 17, wherein the sensor is a fiber optic based sensor.

19. The apparatus of claim 17, wherein the sensor is a Fabry-Perot sensor.

20. The apparatus of claim 17, wherein the sensor housing comprises:
a conical mount having alignment holes; and
a mounting head mated to the conical mount, the mounting head having alignment pins, the alignment pins being inserted in respective ones of the alignment holes, the sensor being disposed in the conical mount and mounting head, the housing hole being through the conical mount.

\* \* \* \* \*